United States Patent [19]
Nishiguchi

[11] Patent Number: 5,387,815
[45] Date of Patent: Feb. 7, 1995

[54] SEMICONDUCTOR CHIP MODULE

[75] Inventor: Masanori Nishiguchi, Yokohama, Japan

[73] Assignee: Sumitomo Electric Industries, Ltd., Osaka, Japan

[21] Appl. No.: 909,206

[22] Filed: Jul. 6, 1992

[30] Foreign Application Priority Data

Jul. 12, 1991 [JP] Japan .................................. 3-172730
Jul. 12, 1991 [JP] Japan .................................. 3-172735
Jul. 12, 1991 [JP] Japan .................................. 3-172738

[51] Int. Cl.$^6$ ........................................... H01L 23/02
[52] U.S. Cl. .................................... 257/704; 257/713; 257/719; 257/722
[58] Field of Search ............... 257/713, 719, 718, 722, 257/704

[56] References Cited

U.S. PATENT DOCUMENTS 4,069,498 1/1978 Joshi .................................. 257/713
4,193,445 3/1980 Chu et al. .............................. 165/79
4,825,284 4/1989 Soga et al. .

FOREIGN PATENT DOCUMENTS 9087843 5/1984 Japan .

OTHER PUBLICATIONS

"LSI Handbook", the first edition, pp. 415–416, The Institute of Electronics and Communication Engineers of Japan, 1984.
"Materials/Processing Approaches to Phase Stabilization of Thermally Conductive Pastes", pp. 713–717, IEEE Transactions of Components, Hybrids, and Manufacturing Technology, vol. 13, No. 4, Dec. 1990.
"Copper Polyimide Multi-layered Wiring Boards", Hybrids, vol. 7, No. 1, pp. 10–12.
Patent Abstracts of Japan, vol. 14, No. 324 (E-0951), Jul. 11, 1990, JP-A-01 109 358 (Hitachi Ltd.), Apr. 23, 1990.
Patent Abstracts of Japan, vol. 007, No. 267 (E-213), Nov. 1983, JP-A-58 148 454 (Mitsubishi Denki KK), Sep. 3, 1983.
Patent Abstracts of Japan, vol. 015, No. 254 (E-1083), Jun. 1991, JP-A-03 082 144 (Hitachi Ltd.), Apr. 8, 1991.
Patent Abstracts of Japan, vol. 011, No. 220 (E-524), Jul. 16, 1987, JP-A-62 039 032 (Matsushita Electric Works Ltd.), Feb. 20, 1987.
Watari et al., Packaging Technology for the NEC SX Supercomputer, IEEE Transactions on Components, Hybrids, and Manufacturing Technology, vol. CHMT-8, No. 4, Dec. 1985, New York, pp. 462–467.
Lodge et al., Prototype Packages in Aluminum Nitride for High Performance Electronic Systems, IEEE Transactions on Components, Hybrids, and Manufacturing Technology, vol. 13, No. 4, Dec. 1990, New York, pp. 633–638.
Cavaliere et al., High-Performance Single-Chip Module, IBM Technical Disclosure Bulletin, vol. 24, No. 1A, Jun. 1981, New York, pp. 46–48.

Primary Examiner—Rolf Hille
Assistant Examiner—Roy Potter
Attorney, Agent, or Firm—Cushman Darby & Cushman

[57] ABSTRACT

The semiconductor chip module comprises a substrate on which a wiring portion is formed, a semiconductor chip mounted so as to face a circuit side down to the wiring portion, a heat sink with one end in contact with a side opposite to the circuit side of the semiconductor chip, and a cap enclosing the semiconductor chip and having an opening exposing externally the other end of the heat sink. A metal film is formed at least on the inner wall of the opening and on the surface of the heat sink which is inserted into the cap. An adhesive material is filled between the tip portion of the heat sink and the semiconductor chip, while an adhesive material is filled between the metal films.

16 Claims, 11 Drawing Sheets

SEMICONDUCTOR CHIP MODULE

BACKGROUND OF THE INVENTION

1. Field of the Invention

The present invention relates to a semiconductor chip module (multi-chip module and single chip module) applicable for the fields of computers and communications the like where high speed signal processing is required, and to a method of manufacturing the same.

2. Related Background Art

With the increasing demand for large-scale function and high speed operation of electronic devices, logic LSIs have achieved high speed operation, with a delay time per gate of several hundreds picosecond. However, the conventional assembling structure which mounts a large number of dual-in packages (DIPs) or plug-in packages on a printed circuit board has become difficult to bring out performance of high speed LSIs sufficiently. In order to overcome such a problem, a multi-chip module system has been developed and put into practical use, which mounts large number of chips on a single ceramic substrate and can provide high speed performance with high density assembling(refer to "LSI HANDBOOK", the first edition, pp. 415–416, The Institute of Electronics and Communication Engineers of Japan, 1984).

A prior art structure which dissipates heat to a cooling plate by contacting a piston on a semiconductor chip by means of a spring has been well-known (refer to "Materials/Processing Approaches to Phase Stabilization of Thermally Conductive Pastes" pp. 713–717, IEEE TRANSACTIONS OF COMPONENTS, HYBRIDS, AND MANUFACTURING TECHNOLOGY, Vol. 13, No. Dec. 4, 1990).

However, a semiconductor chip module employing a piston has a disadvantage of having a large number of components and the cost being extremely high.

SUMMARY OF THE INVENTION

An object of the present invention is to provide a semiconductor chip module and a method of making the same, with a small number of components together with excellent heat dissipation design.

In order to achieve the above object, a semiconductor chip module according to the present invention is characterized by comprising a substrate on which a wiring portion is formed; a semiconductor chip mounted so as to face a circuit side down to the wiring portion; a heat sink of which one end is contacted to a side opposite to the circuit side of the semiconductor chip; and a cap which has an opening for exposing the other end of the heat sink, the cap enclosing the semiconductor chip. Metal films are formed at least on an inner wall of the opening and on a surface of the heat sink which is inserted into the cap. An adhesive material is filled between the tip portion of the heat sink and the semiconductor chip while an adhesive material is filled between the metal films.

And a method of manufacturing the above mentioned semiconductor chip module comprises the steps of: preparing a substrate mounting a semiconductor chip thereon, a cap where a metal film is formed previously on the inner wall of said opening, and a heat sink where a metal film is formed previously on one end thereof; fixing the cap on the substrate; inserting one end of the heat sink into the opening of the cap and then contacting the one end of the heat sink to the semiconductor chip; and embedding an adhesive material between the tip portion of the heat sink and the semiconductor chip by injecting an adhesive material between the metal films while the one end of the heat sink is contacted with the semiconductor chip, to fix the heat sink to the cap, whereby the cap is hermetically sealed.

Further, a semiconductor chip module according to the present invention is characterized by comprising a substrate on which a wiring portion is formed; a semiconductor chip mounted so as to face the circuit side down to the wiring portion; a heat sink of which one end is contacted to the side opposite to the circuit side of the semiconductor chip; and a cap having an opening for exposing the other end of the heat sink, the cap enclosing the semiconductor chip. Metal films are formed at least on the inner wall of the opening and on the surface of the heat sink facing the inner wall of the cap. A resin material of high thermal conductivity such as thermal compound is filled between the tip portion of the heat sink and the semiconductor chip.

And a method of manufacturing the above mentioned semiconductor chip module comprises the steps of: preparing a substrate mounting a semiconductor chip thereon, a cap where a metal film is formed previously on the inner wall of the opening, and a heat sink where a metal film is formed previously on the surface of the heat sink facing the inner wall; fixing the cap on the substrate; pouring a resin material of high thermal conductivity such as a thermal compound into the opening of the cap to coat the resin material on the semiconductor chip; inserting the one end of the heat sink into the opening of the cap and then contacting the one end of the heat sink to the semiconductor chip; and embedding an adhesive material between the metal films to fix the heat sink on the cap, while the one end of the heat sink is contacted with the semiconductor chip, whereby the cap is hermetically sealed.

According to the semiconductor chip module of the present invention, the heat sink is fixed securely on the inner wall of the cap opening. The heat which is generated from a specific semiconductor chip producing a relatively large amount of heat is transmitted effectively toward one end of the heat sink by way of an adhesive material or a thermal compound and the heat is transmitted from one end of the heat sink to the other end (lower temperature side) thereof. By this heat conduction, the heat is conducted outside the cap and dissipated outside the cap.

According to the method of manufacturing a semiconductor chip module of the present invention, when one end of the heat sink is inserted into the opening of the cap, it is pressed against the semiconductor chip, for example, by its own weight. Since either an adhesive material or a resin material of high thermal conductivity is filled between the tip portion of the heat sink and the semiconductor chip, the heat transfer area becomes large. Under such condition, the adhesive material is filled into the opening of the cap to fix the heat sink. The adhesive material is filled between the inner wall of the cap and the heat sink without any void therein to shut off air passage flowing in and out.

In order to achieve the above object, the semiconductor chip module according to the present invention is constituted of a substrate on which a wiring portion is formed; a semiconductor chip mounted so as to face the circuit side thereof down to the wiring portion; a heat sink of which one end is contacted to the side opposite to the circuit side of the semiconductor chip; and a cap which has an opening for exposing the other end of the heat sink, and encloses the semiconductor chip. A groove is formed so as to surround the area contacting with the heat sink in the semiconductor chip. Metal films are formed at least on the inner wall of the opening and on the surface of the heat sink which is inserted into the cap. An adhesive material is filled between the metal films, while an adhesive material is filled between the tip portion of said heat sink and the semiconductor chip.

Furthermore, a method of manufacturing the above mentioned semiconductor chip module, comprises the steps of: preparing a substrate mounting a semiconductor chip having a groove therein, a cap which has a metal film formed previously on the inner wall of an opening, and a heat sink which has a metal film formed previously on one end thereof; fixing the cap on the substrate; inserting the one end of the heat sink into the opening of the cap for contacting the one end of the heat sink to the semiconductor chip; and embedding an adhesive material between the tip portion of the heat sink and said semiconductor chip by injecting an adhesive material between said metal films to fix the heat sink to the cap while the one end of the heat sink is contacted to the semiconductor chip, whereby the cap is hermetically sealed.

According to the semiconductor chip module of the present invention, the heat sink is fixed securely to the inner wall of the cap opening. The heat generated from the specific semiconductor chip which provides a relatively large amount of heat is transmitted effectively toward one end of the heat sink by way of the adhesive material or a thermal compound. And the heat is transmitted from the one end to the other end of a heat sink(lower temperature side). By this heat conduction, the heat is conducted outside the cap, and is dissipated outside the cap.

According to the method of manufacturing a semiconductor chip module of the present invention, when one end of the heat sink is inserted into the opening of the cap, it is pressed against the semiconductor chip, for example, by its own weight. Since an adhesive material is filled between the tip portion of the heat sink and the semiconductor chip, the heat transfer area becomes large. Under such a condition, an adhesive material is filled into the opening of the cap to fix the heat sink. The heat sink fixing adhesive material is filled between the inner wall of the cap and the heat sink without any void therein to shut off passage of air flowing in and out. Furthermore, when the adhesive material is injected into the opening of the cap, the excessive adhesive material is absorbed into the groove formed in the semiconductor chip, whereby the adhesive material does not drop off from the semiconductor chip.

In order to achieve the object, the semiconductor chip module according to the present invention is constituted by comprising a substrate on which a wiring portion is formed; a semiconductor chip mounted so as to face a circuit side down to the wiring portion; a heat sink with one end thereof in contact with the opposite side to the circuit side of the semiconductor chip; and a cap which has an opening for exposing the other end of the heat sink, the cap enclosing the semiconductor chip, characterized in that the substrate has an insulating film which is formed at a predetermined area positioned in the vicinity of the peripheral portion of the semiconductor chip, metal films are formed at least on an inner wall of the opening and on a surface of the heat sink to be inserted into the interior of the cap, an adhesive material is filled between the metal films, and the adhesive material is filled between the tip portion of the heat sink and said semiconductor chip.

According to the semiconductor chip module of the present invention, the heat sink is firmly fixed to the inner wall of the opening of the cap, the heat generated from the semiconductor chip which provides relatively much exothermic heat is efficiently transmitted to one end portion of the heat sink through the adhesive material. And the heat is transmitted from the one end to the other end of the heat sink(lower temperature portion). By this heat conduction, the heat is conducted to the outside of the cap, and is dissipated outside the cap. In addition, the overflowed adhesive material falls onto the insulating film, so that it does not contact with the wiring portion of the substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENT

Figure 1:
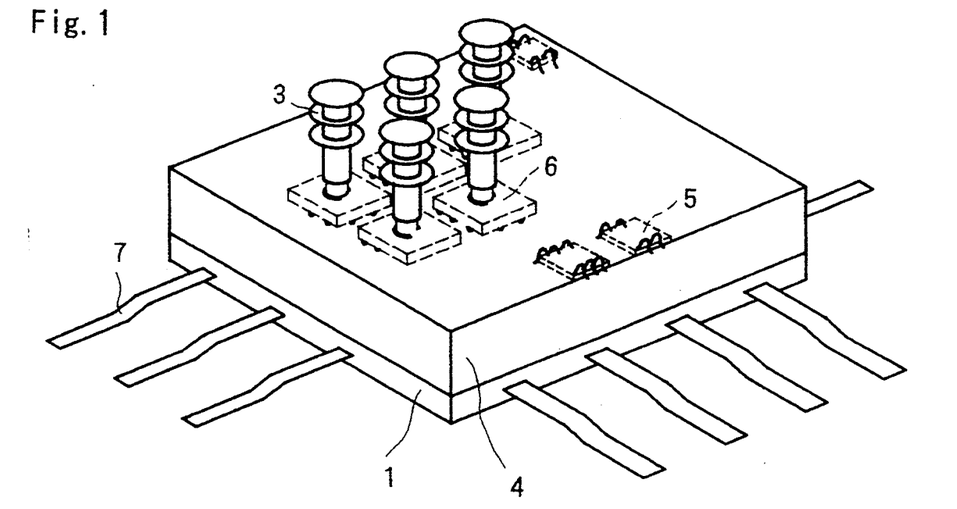
FIG. 1 is a perspective view showing the appearance of a multi-chip module according to the invention.
Figure 2:
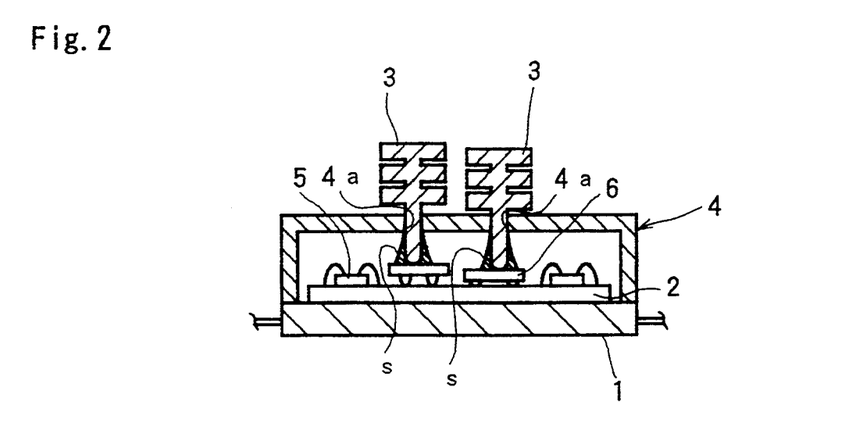
FIG. 2 is a longitudinal cross sectional view cutting along/the heat sink of a multi-chip module according to the invention.

Firstly, the fundamental structure of the semiconductor chip module according to the invention is explained with reference to FIGS. 1 and 2.

A multi-chip module according to the present embodiment includes a lower substrate 1, an upper substrate 2, a heat sink 3, and a cap 4. The lower substrate 1 is made of an aluminum oxide material, and has plural lead pins 7 extending from the side surfaces thereof, the lead pins being connected to electric circuits formed with the upper substrate 2. The upper substrate 2 is made of an insulating material of low dielectric constant. For example, a polyimide multi-layered wiring structure having 3 inches square size, a thermal resistance of 3° C./W with a thermal via may be used(refer to "Copper Polyimide Multi-layered Wiring Boards", HYBRIDS, Vol. 7, No. 1, pp. 10–12).

The lower substrate 1 is formed of a plate larger than the upper substrate 2, and the upper substrate 2 is piled securely on the upper surface thereof. The fringe of the cap 4 covers the upper surface of the lower substrate 1 which is not covered by the upper substrate 2. For that reason, the upper substrate 2 is enclosed with the cap 4 and the lower substrate 1.

The upper substrate 2 has electrodes exposed on the surface thereof and semiconductor chips 5 and 6 connected to the electrodes is mounted thereon. The semiconductor chips 5 and 6 are made of, for example, an IC chip of 10 mm square, and are connected to the electrodes formed on the surface of the upper substrate 2 by using a wire bonding method or a face-down bonding method (flip chip bonding method). In FIGS. 1 and 2, the semiconductor chip 5 indicates an IC chip mounted with a wire bonding method and the semiconductor chip 6 indicates an IC chip mounted by a face-down bonding method. Therefore, the circuit side of the semiconductor chip 5 faces the cap 4, and the circuit side of the semiconductor chip 6 faces the upper substrate 2.

The cap 4, for example, is formed of 1 mm thick Kovar in a shape of a lid. An opening 4a with an inner diameter of 6 to 8 millimeter is formed in the cap 4 at the position corresponding to the mounting position of the semiconductor chip 6 which produces a relatively large amount of heat. One end of the heat sink 3 is inserted into the opening 4a. Usually, the opening 4a has the same diameter at the inlet and outlet thereof, but may have different outlet and inlet diameters.

Herein, metals such as aluminum, copper-tungsten alloy and the like, and ceramics materials such as ALN, SiC and the like may be used as a material for cap 4.

The heat sink 3 is made of a material of high heat conductivity such as Al, CuW, AlN, CBN, and diamond, etc. and includes an insertion portion and a heat dissipation portion. The insertion portion has a shape which allows to be easily inserted into the above mentioned opening 4a, for example, a rod shape. Since the heat dissipation portion is exposed to the outside of the cap 4, it has a large surface area that is easily cooled by natural cooling, for example, formed in a disc shape. For that reason, the insertion of the heat sink into the interior of the cap 4, is simple and the contact to the upper surface of the semiconductor chip 6 is easy, whereby the heat generated from the semiconductor chip 6 can be dissipated outside the cap effectively. A metal film is coated on the surface of the one end of the heat sink inserted into the cap 4, and a solder is coated on the surface thereof so as to flow down upon the semiconductor chip 6 around the tip portion of the heat sink 3 (refer to FIG. 2).

The outer diameter of the heat sink basically varies depending on the heat generation region of the semiconductor chip module. For example, when a 10 mm×10 mm IC chip is used and the heat generation region thereof extends over the whole upper surface thereof, it is desired to use a heat sink of 10 mm in diameter. However, when the heat generation region is restricted to a part, it is sufficient to use such a heat sink being enough to cover such a region. The hole diameter of cap 4 is preferably ca. 0.05 mm larger than the outer diameter of the heat sink when the material to be used is a metal, or ca. 0.1 mm larger than the outer diameter of the heat sink when the material to be used is ceramics.

Figure 3A:
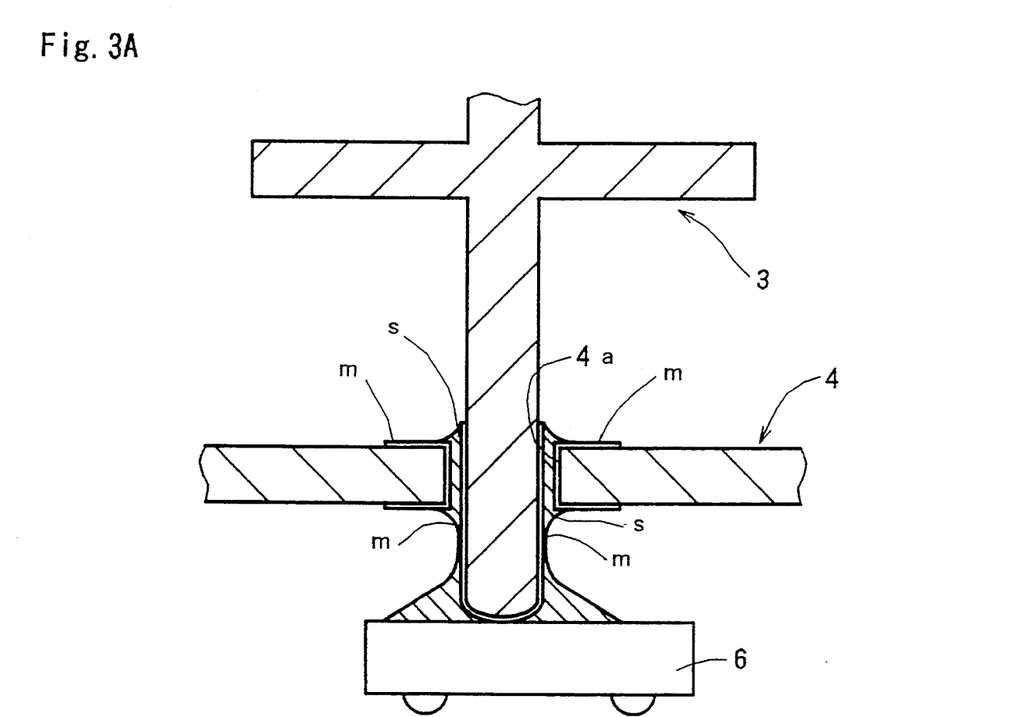
FIGS. 3A and 3B are cross sectional views showing an example of the mounting structure of a heat sink capable of being used for the multi-chip module of the first embodiment.

Next, referring to FIGS. 3 and 4, an explanation will be made as for a first embodiment of a heat sink mounting structure. FIG. 3A shows a structure where a metal is coated on the inner wall of an opening while a metal is coated on the surface of one end of a heat sink inserted into the opening. The metal "m" which is coated on the heat sink 3 and the cap 4 has a wettable property with respect to the solder to be used. Therefore, a voidless (bubble-less) soldering can be performed, whereby the cap 4 can be hermetically sealed reliably. For example, in the case where Sb/Pb series solder is used, a metal such as AgSn, AgPd, or the like may be used. The embedding of any solder "s" into the gaps between the semiconductor chip 6 and the tip portion of the heat sink 3 can be achieved by flowing the liquid solder "s" between the heat sink 3 and the inner wall of the opening 4a. A low temperature soldering material added with Bi, Cd, and In may be used as the solder "s". In this case, the heat sink 3 may be pre-heated to ease the run of the solder "s".

Figure 3B:
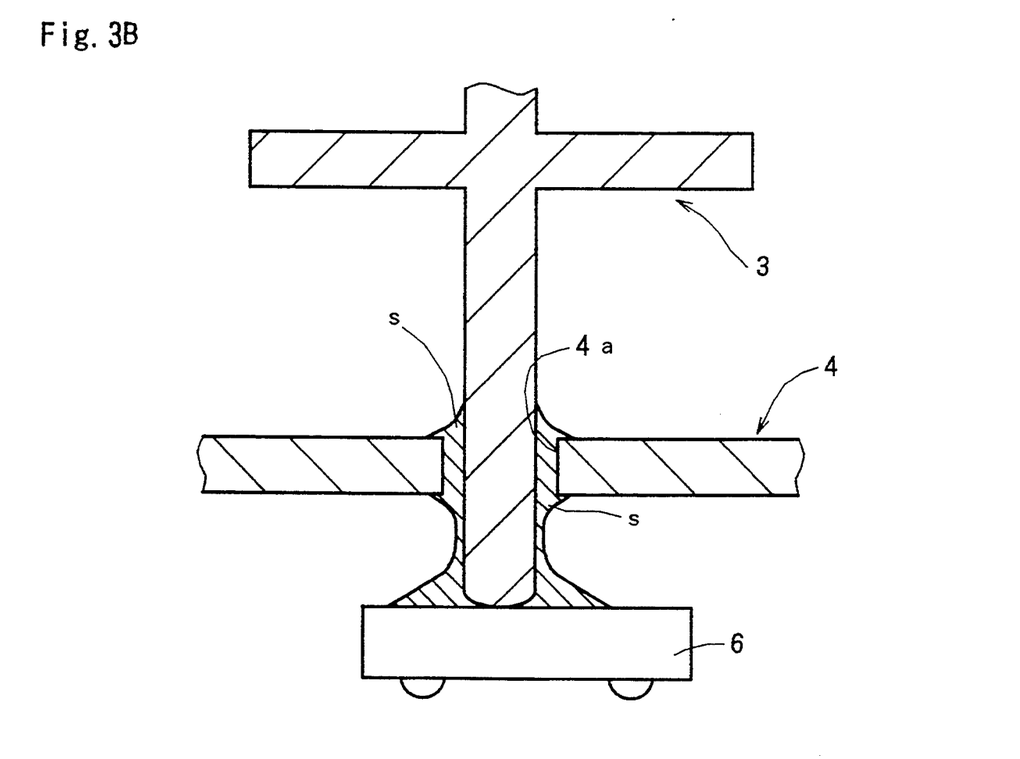

When the materials of heat sink 3 and cap 4 have sufficient wettability, the above mentioned metal coating is not necessary (see FIG. 3B).

In this case, the gap between heat sink 3 and cap 4 is filled with solder "s". The solder "s" flows along heat sink 3, and a conical solder part is formed on semiconductor chip 6. Therefore, the heat from semiconductor chip 6, which is not in direct contact with heat sink 3, is conducted through solder "s" to heat sink 3.

Next, an explanation will be made regarding the method of manufacturing a multi-chip module, according to the present embodiment. The multi-chip module having the mounting structure shown in FIG. 3A is packaged, after preparing the substrate 2 mounting the semiconductor chips 5 and 6, the cap 4 wherein a metal "m" is coated previously on the inner wall of the opening 4a, and the heat sink 3 wherein a metal "m" is coated previously on one end; for example, by way of the steps of: (1) enclosing the upper surface of the upper substrate 2 fixed on the lower substrate 1 with the cap 4 (See FIG. 2); (2) inserting one end of the heat sink 3 into the opening 4a of the cap 4 and then contacting the tip end thereof to the upper surface of the semiconductor chip 6 (See FIG. 1); and (3) fixing the heat sink 3 on the cap 4 by injecting a large amount of liquid solder "s" into the gap between the inner wall of the opening 4a of the cap 4 and the heat sink 3, while the heat sink 3 is contacted to the semiconductor chip 6, to fix the heat sink 3 to the cap 4, whereby the cap 4 is sealed hermetically.

In this case, since the one end of the heat sink 3 contacts naturally to the semiconductor chip 6 due to its own weight, when the liquid solder "s" is injected, it is possible to fix simply the heat sink 3 to the cap 4.

Since the solder "s" is filled closely between the heat sink 3 and the inner wall of the cap 4a, the cap 4 can be sealed hermetically. In particular, when the thin film multi-layered substrate such as polyimide/Cu is used as the upper substrate, the hermetical sealing becomes more important because of the moisture absorption property of the polyimide.

Furthermore, since a metal "m" is coated on the tip portion of the heat sink 3, the solder "s" is filled in around the tip portion of the heat sink 3 and onto the semiconductor chip 6 by its own weight of the solder "s". As a result, the contact area of the semiconductor chip 8 to the heat sink 3 increases, whereby reduction of the thermal resistance can be realized.

Next, an example of the mounting structure of the heat sink according to the second embodiment is explained with reference to FIGS. 4A and 4B.

Figure 4A:
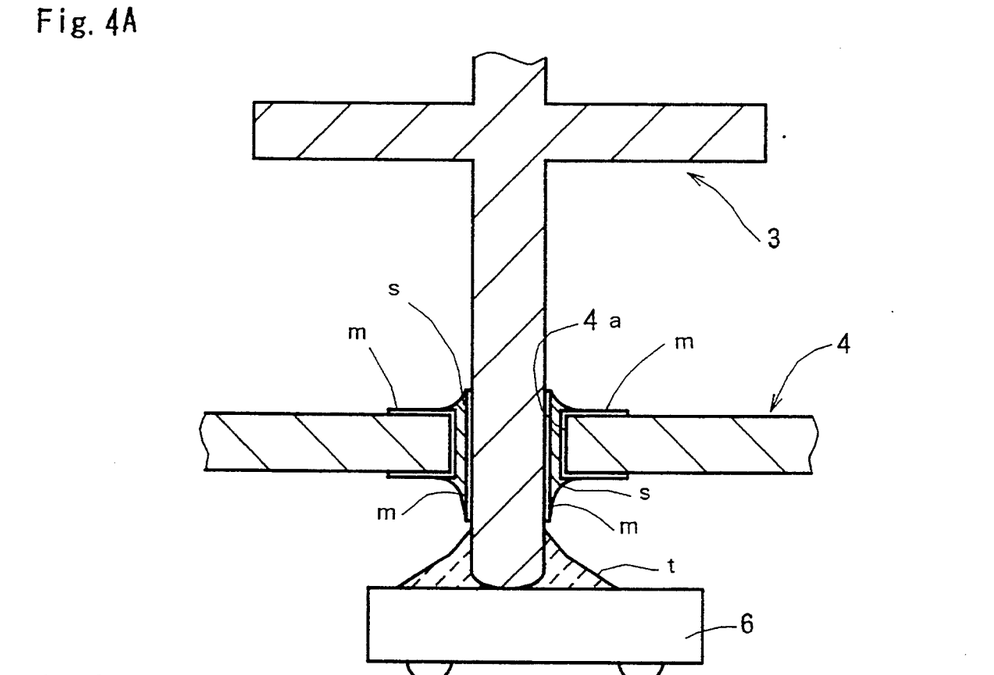
FIGS. 4A and 4B are cross sectional views showing an example of the mounting structure of a heat sink capable of being used for the multi-chip module of the second embodiment.
Figure 4B:
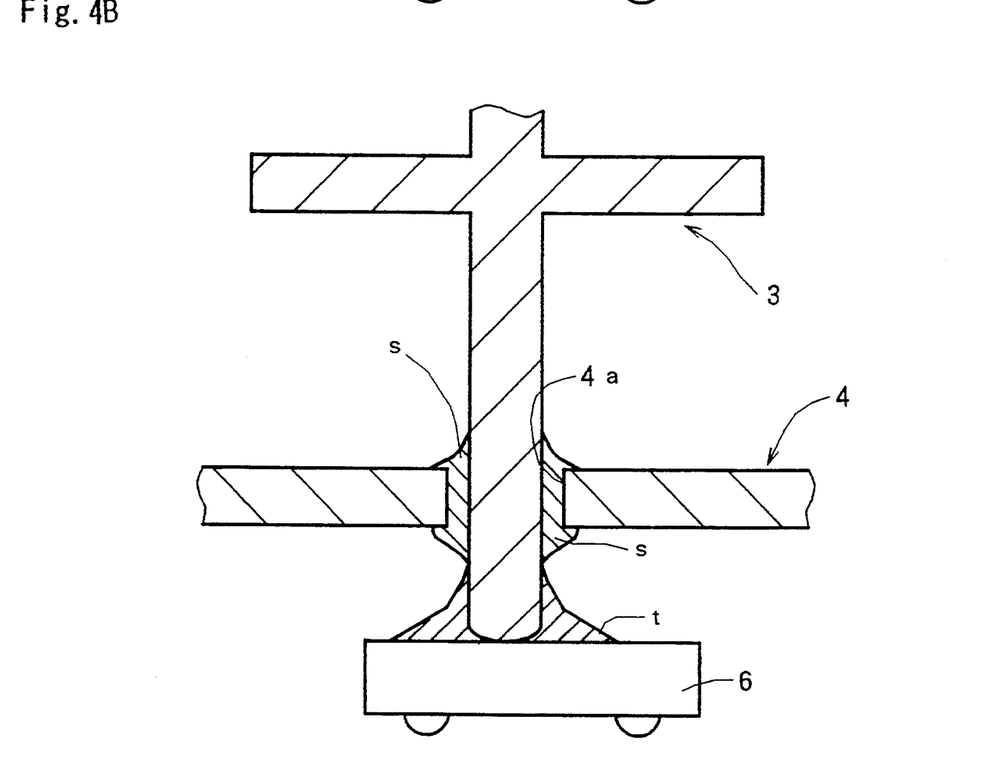

FIG. 4A indicates a structure where a thermal compound is filled onto the semiconductor chip around the tip portion of the heat sink. In this case, a metal "m" is formed on the inner wall of the opening 4a of the cap 4 and on the surface of the heat sink 3 facing the inner wall. At the tip of the heat sink 3, a thermal compound "t" containing BN particles or Ag paste is filled around the tip portion of the heat sink 3 onto the semiconductor chip 6. For that reason, the effective contact area between the semiconductor chip 6 and the heat sink 3 increases, thus resulting in the reduction of the thermal resistance.

The heat sink 3 is fixed on the cap 4 using a solidified solder "s", while one end thereof is contacted on the semiconductor chip 6. Since the above mentioned materials and heating method may be employed for the solder "s", a further explanation is omitted.

As mentioned above, since the multi-chip module according to the present embodiment mounts a heat sink only to a semiconductor chip requiring heat dissipation (generating a large amount of heat), the heat dissipation for a multi-chip module can be performed selectively and efficiently.

In this case, a single heat sink is mounted with respect to a single semiconductor chip and one end of the heat sink can be adjusted structurally in length in the inserted direction. Therefore, even if plural semiconductor chips each having a different height with respect to the substrate surface are mounted on a substrate, heat sinks can be mounted reliably to respective semiconductor chips.

Furthermore, since heat sinks are mounted separately to individual semiconductor chip, the present invention can be applied for a multi-chip module which includes semiconductor chips each mounted using face-down method and wire bonding method, whereby the practical value is high.

Next, a method of manufacturing the multi-chip module stated above is explained.

The multi-chip module having the mounting structure shown in FIG. 4A is packaged, after preparing the substrate 2 mounting the semiconductor chips 5 and 6 thereon, the cap 4 wherein a metal "m" is coated previously on the inner wall of the opening 4a, and the heat sink 3 wherein a metal "m" is coated previously on one end; for example, by way of the steps of: (1) enclosing the upper surface of the upper substrate 2 fixed on the lower substrate 1 with the cap 4; (2) dropping down a thermal compound "t" through the opening 4a of the cap 4 to coat the upper surface of the semiconductor chip 6; (3) inserting the one end of the heat sink 3 into the opening 4a of the cap 4 and then contacting the one end of the heat sink 3 on the upper surface of the semiconductor chip 6; and (4) filling a large amount of liquid solder "s" into the gap between the inner wall of the opening 4a of the cap 4 and the heat sink 3, while the heat sink 3 is contacted to the semiconductor chip 6, to fix the heat sink 3 to the cap 4, whereby the cap 4 is sealed hermetically.

In this case, an increased contact area between the semiconductor chip 6 and the heat sink 3 and a decreased thermal resistance can be obtained without performing a metal coating on the tip portion of the heat sink 3 and a multi-chip module with excellent thermal dissipation can be manufactured.

The present invention should not be restricted to the above embodiment. In the present embodiment, a semiconductor chip module which includes not only a semiconductor chip packaged using wire bonding method, but also a multi-chip module mounted with a heat sink to the semiconductor chip packaged using a face-down process has been explained as one example. However, the present invention also is applicable for a semiconductor chip module mounted with a single semiconductor chip and may include flipped chips without being mounted with a heat sink. Furthermore, the opening of the cap should not be limited to be circular. The shape may be rectangular or polygonal, if it is nearly similar to that of one end of the heat sink. Without being limited to the thermal compound, any resin material may be used if it has a thermal conductivity higher than that of the material forming the cap or semiconductor chip and to certain extent heat-resistance and liquidity.

As the present invention has the above described structure, it can be applied to multi-chip modules and single-chip modules. The present invention also can provide a semiconductor chip module which is formed of a small number of components and capable to be designed with excellent thermal dissipation.

Furthermore, the multi-chip module embodying the present invention can tolerate variations in height caused by the face-down bonding process, thus improving reliability. The small number of components for a semiconductor chip module enables to reduce the number of manufacturing steps as well as the cost of the semiconductor chip module.

Next, referring to FIGS. 5A to 9B, an explanation will be made as for an example of a heat sink mounting structure according to the third embodiment.

Figure 5A:
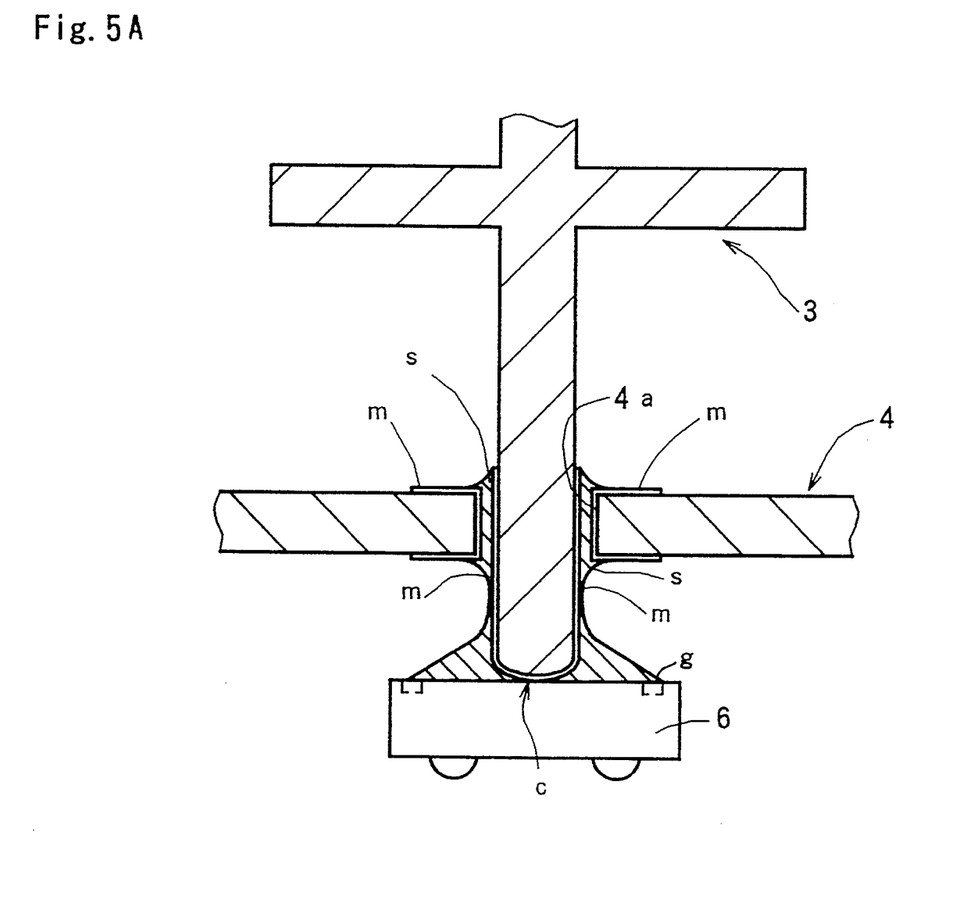
FIGS. 5A, 5B, 6A, 6B, 7A,7B, 8A, 8B, 9A and 9B are cross sectional views showing an example of the mounting structure of a heat sink capable of being used for the multi-chip module of the third embodiment.
Figure 5B:
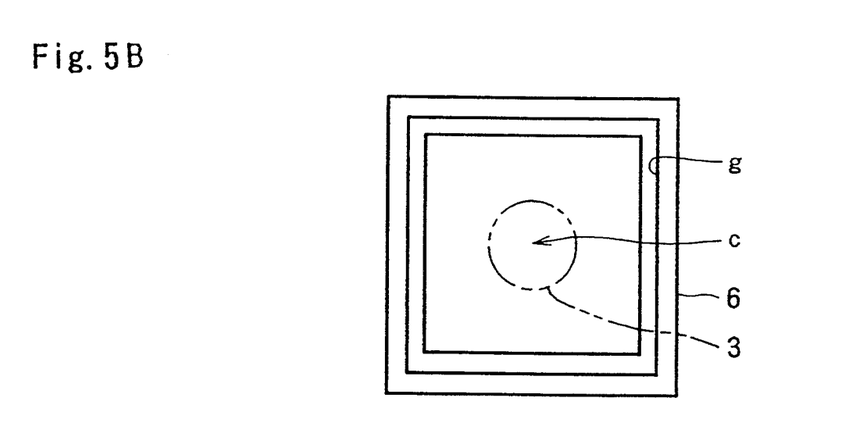

A groove "g" which has a cross-section in a concave form and looped in a rectangular form in the upper surface of a mounted semiconductor chip 6, is formed so as to surround the area "c" where the heat sink 3 contacts the semiconductor chip 6. The groove "g" is formed by 1) coating a photo-resist material, for example, through a spin-coating process, 2) forming a photo-resist pattern having an opening at a groove forming portion using photo-lithographic technique, performing an isotropic etching through chemical etching with the obtained photo-resist pattern as a mask, and 4) removing the photo-resist pattern later. In the case where the semiconductor chip 6 is formed of Si, a hydrazine and an ethylenediamine may be used as an etchant. In the case where the semiconductor chip 6 is formed of GaAs, $H_3PO_4$ may be used as an etchant. Generally, the upper surface of the semiconductor chip 6 is frequently metallized, the metallized portion may be etched after using a patterning process.

A metal "m" is coated on the inner wall of the opening 4a in a cap. A metal "m" also is coated on the surface of one end of the heat sink 3 inserted into the opening 4a. Since the metal "m" coated on the heat sink 3 and the cap 4 has a wettable property with respect to a solder "s", a void-less soldering can be performed, whereby the cap 4 can be sealed hermetically. For example, when using Sb/Pb solder, it is desirable to use a metal such as AgSn, AgPd, and the like.

The embedding of the solder "s" onto the semiconductor chip 6 around the tip portion of the heat sink 3 is achieved by pouring the liquid solder "s" between the heat sink 3 and the inner wall of the opening 4a. A low temperature solder added with Bi, Cd, In may be used as the solder "s". In this case, the heat sink 3 may be pre-heated to ease the run of the solder "s".

Here, what is important is that a closed groove "g" in a rectangular shape is formed around the area "c" on the semiconductor chip 6 which contacts the tip portion of the heat sink 3. For that reason, when a large amount of liquid solder "s" is injected into the opening 4a, the excessive solder "s" flows into the groove "g", thus being prevented from dropping onto the substrate 2. Since no short-circuit of the wiring on the substrate 2 is caused by the overflowed excessive solder, the multi-chip module can be improved in its yield and reliability.

Figure 6A:
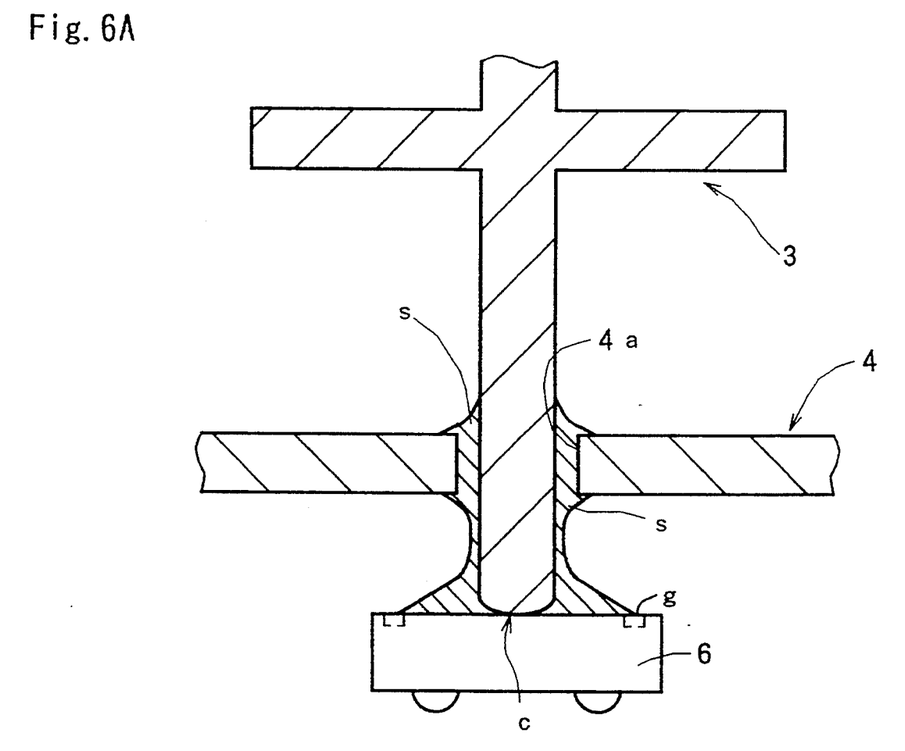
Figure 6B:
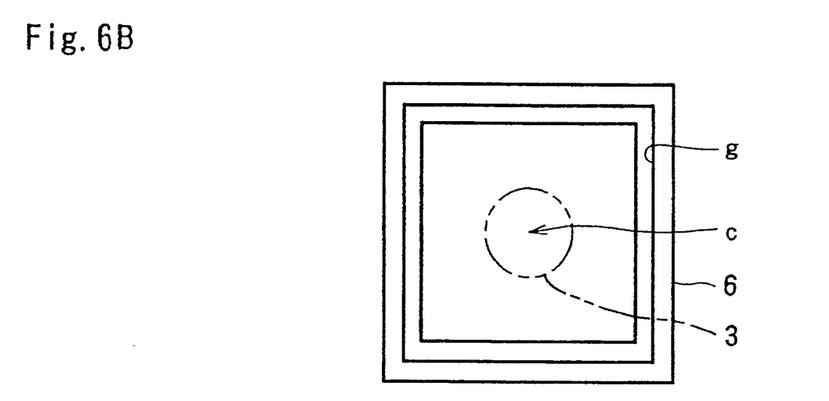
Figure 7A:
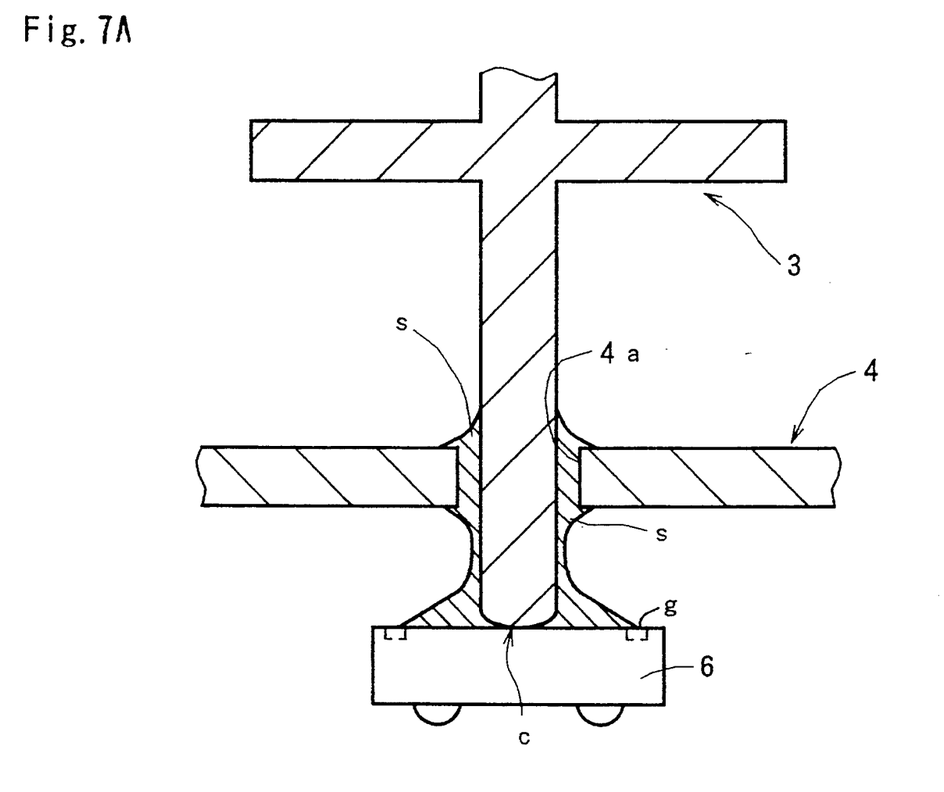
Figure 7B:
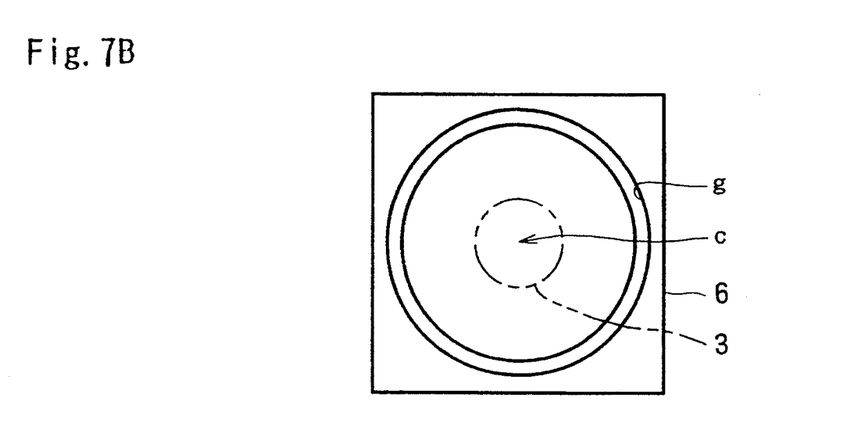

When the materials of heat sink 3 and cap 4 have sufficient wettability, the above mentioned metal coating is not necessary (see FIG. 6A and FIG. 6B). Moreover, the groove shape is not limited to a rectangular one; a circular one may also be accepted (see FIG. 7A and FIG. 7B). Furthermore, the edge of the rectangular may be extended to from an opening on the side surface of semiconductor chip 6 (see FIG. 8A and FIG. 8B).

Figure 8A:
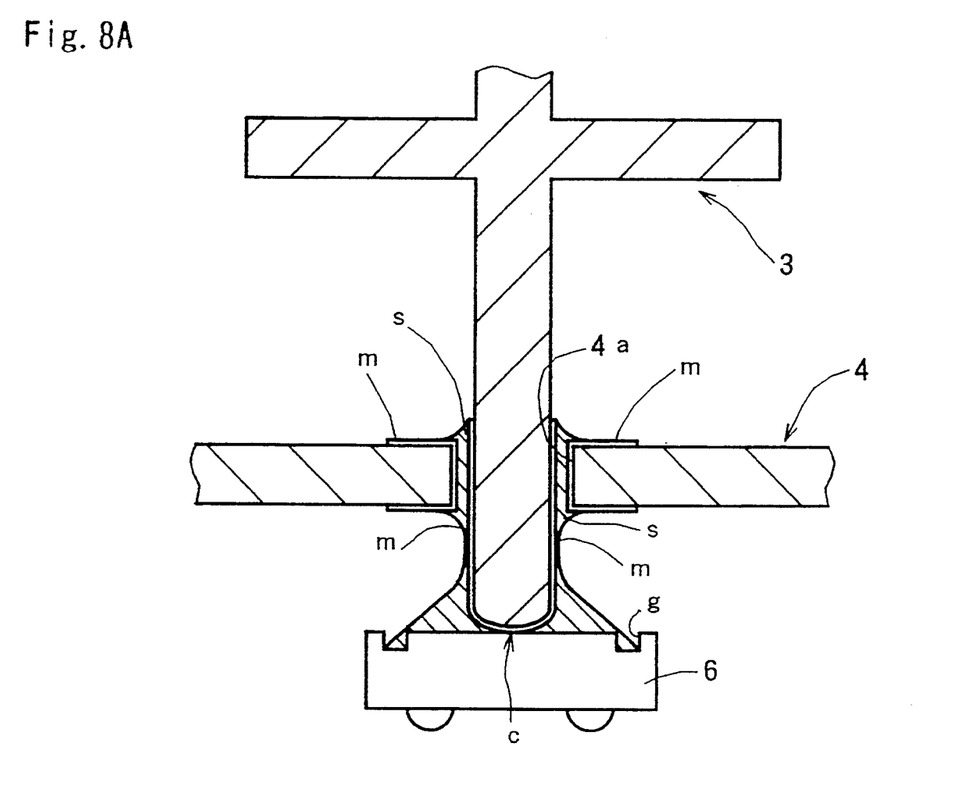
Figure 8B:
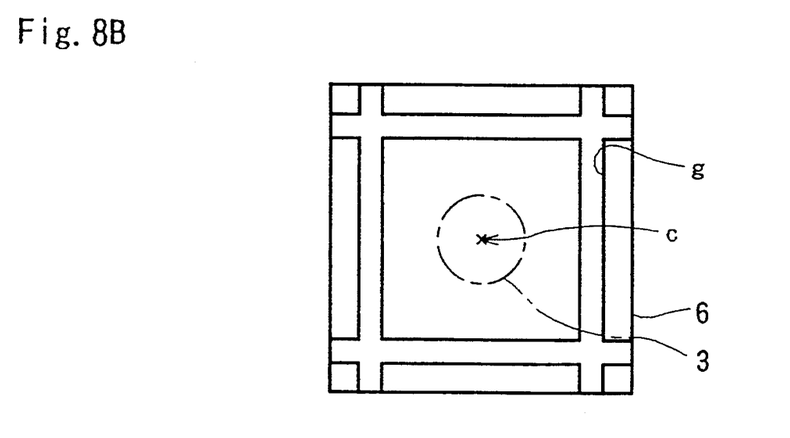

FIG. 8 indicates a mounting structure of a heat sink and a semiconductor chip on which a pair of parallel grooves is formed on the upper surface of the semiconductor chip and which mutually cross each other to reach the edge thereof.

The groove "g" is formed by grinding with a diamond blade. Therefore, the processing can be performed at convenient time in the manufacturing steps and provides a large degree of freedom. When the material of the semiconductor chip 6 is Si, it is desirable to use a blade with an abrasive grain of about #2000. In case of GaAs, it is desirable to use a blade with an abrasive grain of about #4000 since GaAs is more fragile than Si. If the concave of groove "g" has a width of 50 μm and a depth of 30 μm, short-circuit failure can be prevented effectively. Since the structures of the heat sink 3 and the cap 4 is basically the same as the above mentioned structure, the explanation is omitted.

Figure 9A:
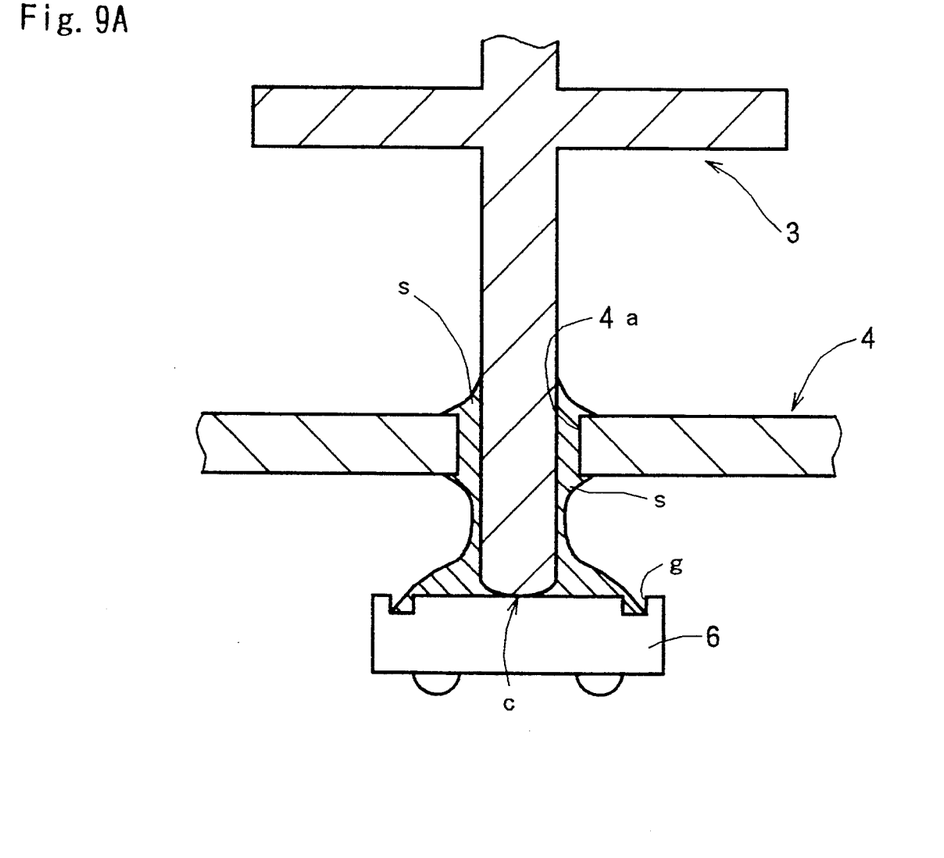
Figure 9B:
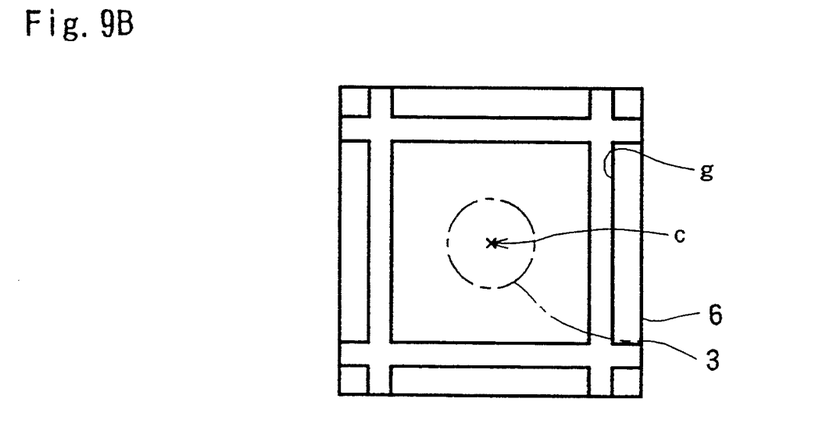

As described above, when the materials of heat sink 3 and cap 4 have sufficient wettability, the above mentioned metal coating is not necessary (see FIG. 9A and FIG. 9B).

According to the multi-chip module of the present embodiment, since a heat sink is mounted only on a semiconductor chip requiring heat dissipation (producing a large amount of heat), it is possible to perform effectively and selectively the heat dissipation for a multi-chip module.

In this case, a single heat sink is mounted on a single semiconductor chip and one end of the heat sink can be adjusted structurally in length in the inserted direction. Therefore, even if plural semiconductor chips which are different in height with respect to the substrate surface are mounted on a substrate, the heat sink can be mounted reliably on individual semiconductor chip.

Furthermore, since heat sink is mounted individually to each of the semiconductor chips, the present invention can be applied for a multi-chip module which includes semiconductor chips mounted with face-down method and wire bonding method, thus providing higher practical value.

Next, an explanation will be made regarding the method of manufacturing a multi-chip module, according to the present embodiment. The multi-chip module having the mounting structure shown in FIGS. 5A, 5B, 8A and 8B is packaged, after preparing the substrate 2 mounting the above mentioned semiconductor chips 5 and 6, the cap 4 wherein a metal "m" is coated previously on the inner wall of the opening 4a, and the heat sink 3 wherein a metal "m" is coated previously on the one end; for example, by way of the steps of: (1) enclosing the upper surface of the upper substrate 2 fixed on the lower substrate 1 with the cap 4; (2) inserting the one end of the heat sink 3 into the opening 4a of the cap 4 to contact the tip portion of the heat sink 3 to the upper surface of the semiconductor chip 6; and (3) fixing the heat sink 3 on the cap 4 by injecting a large amount of liquid solder "s" into the gap between the inner wall of the opening 4a of the cap 4 and the heat sink 3, while the heat sink 3 is contacted to the semiconductor chip 6, to fix the heat sink 3 to the cap 4, whereby the cap 4 is sealed hermetically.

In this case, since the one end of the heat sink 3 contacts naturally the semiconductor chip 6 due to its own weight, it is possible to fix simply the heat sink 3 to the cap 4 when the solder is injected.

Since the solder "s" is filled closely between the heat sink 3 and the inner wall of the cap 4a, the cap 4 can be sealed hermetically. In particular, when the thin film multi-layered substrate such as polyimide/Cu is used as the upper substrate 2, the hermetical sealing becomes more important because of the moisture absorption property of the polyimide.

Furthermore, since a metal is coated on the tip portion of the heat sink 3, the solder "s" fills in any gaps between the tip portion of the heat sink 3 and the semiconductor chip 6 by its own weight. As a result, the contact area of the semiconductor chip 6 to the heat sink 3 increases, whereby the thermal resistance can be reduced.

The present invention should not be restricted to the above embodiment. In the present embodiment, although a multi-chip module containing a semiconductor chip mounted using face-down method and a semiconductor chip mounted using wire bonding method, and having a heat sink provided on the semiconductor chip mounted using face-down method has been explained as one example, however, the present invention also is applicable for a semiconductor chip module mounting a single semiconductor chip and may include flipped chips without being mounted with a heat sink. Furthermore, the opening may be rectangular or polygonal, if its shape is nearly similar to that of one end of the heat sink, without being limited to a circular form.

In the present embodiment, a groove having a concave cross-section and looped in a rectangular form has been shown as an example, but the cross-sectional shape should not be limited to those mentioned above. The cross-section may be a V-shaped or a trapezoid form. The loop may be circular, polygonal, or elliptic. The present invention having the above described structure can be applied to multi-chip modules and single-chip modules. The present invention also can provide a semiconductor chip module which is formed of a small number of components and can be designed with excellent thermal dissipation.

Furthermore, the multi-chip module embodying the present invention can tolerate variations in height caused by the face-down bonding process, which improves reliability. The small number of components for a semiconductor chip module enables to reduce the number of manufacturing steps as well as the cost of the semiconductor chip module.

Figure 10A:
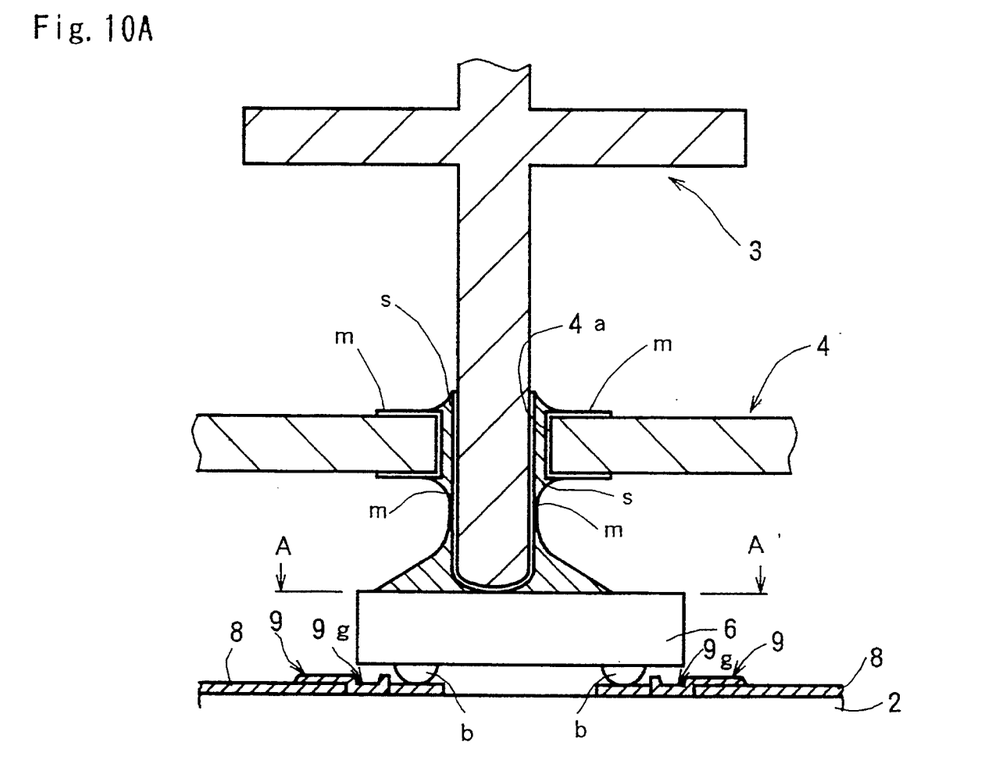
FIGS. 10A, 10B, 11A and 11B are cross sectional views showing an example of the mounting structure of a heat sink capable of being used for the multi-chip module of the fourth embodiment.
Figure 10B:
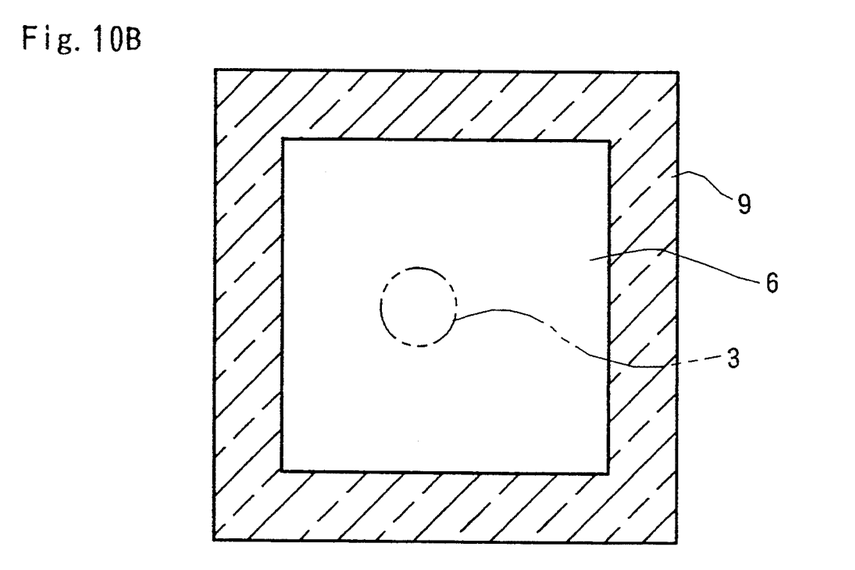
Figure 11A:
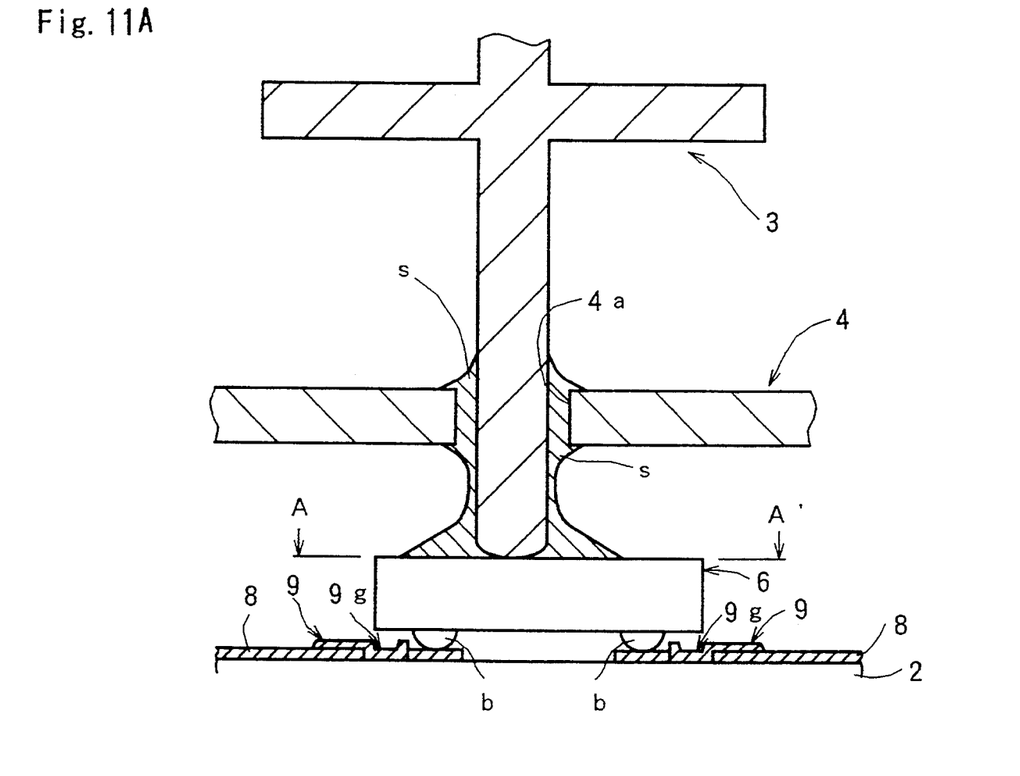
Figure 11B:
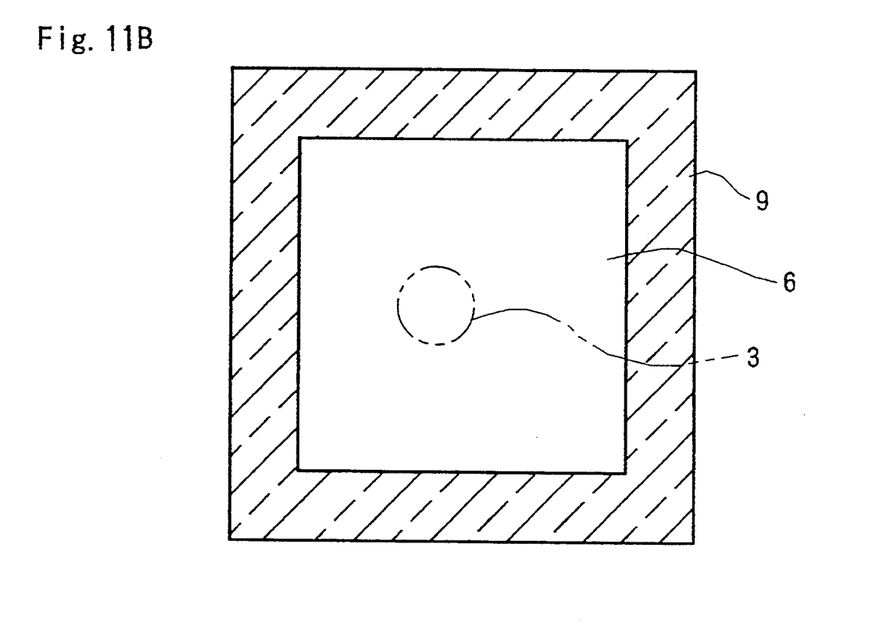

Next, with reference to FIGS. 10A to 11B, explanation will be made for an example of a heat sink mounting structure according to the fourth embodiment. FIG. 10 shows a mounting structure of the semiconductor chip mounted on the upper substrate on which the insulating film is formed and the heat sink. The FIGS. 10A and 11A are vertical cross-sectional view obtained by cutting along the insertion direction of the heat sink, and FIGS. 10B and 11B are plan view of the semiconductor chip cut along the line A-A' in the same figure (a). The insulating film 9 is arranged in a rectangular shape along the peripheral portion of the semiconductor chip 6. The material of the insulating film 9 can be formed with a polyimide material, $SiO_2$ when the upper substrate 2 is formed with copper polyimide, and a film thickness thereof is desirably not less than about 3 $\mu$m when a film thickness of the copper polyimide for forming the upper substrate 2 is thin. The film thickness not less than about 3 $\mu$m can prevent generation or expansion of a pin hole due to heat of solder to cause short circuit of wiring.

In addition, the metal "m"is coated on the inner wall of the opening 4a of the cap, and the metal "m"is also coated on the surface of one end portion of the heat sink 3 to be inserted into this opening 4a. The metal "m", which is coated on the heat sink 3 and the cap 4, has a wettable property with respect to the solder "s", so that it becomes possible to perform solder connection without void (bubble), and the cap 4 can be sufficiently sealed in an air-tight manner. For example, when a solder of Sb/Pb is used, it is preferable to use metal such as AgSn, AgPd or the like.

Incidentally, filling of the solder "s" onto the semiconductor chip 6 around the tip portion of the heat sink 3 can be achieved by pouring the solder "s" in a liquid state from a gap between the heat sink 3 and the inner wall of the opening 4a. As a material of the solder "s", a low temperature solder in which Bi, Cd and In are added can be used. In this case, the heat sink 3 may be heated so as to allow the solder "s"to to flow easily.

As mentioned above, according to the multi-chip module of the present embodiment, the heat sink is mounted only to the semiconductor chip which requires heat dissipation (having a large amount of exothermic heat), so that the heat dissipation of the multi-chip module becomes possible selectively and efficiently.

In this case, since a single heat sink is mounted to a single semiconductor chip and one end portion of the heat sink can be adjusted structurally in length in the inserted direction, the heat sink is mounted reliably to the individual semiconductor chip even when the substrate is packaged with a plurality of semiconductor chips which are different in height with respect to the substrate surface.

Furthermore, since the heat sink is individually mounted to each of the semiconductor chips, application is possible to a multi-chip module which includes semiconductor chips mounted using the face-down method and semiconductor chips mounted using the wire bonding method in a mixed manner, which enhances its utility.

As described above, when the materials of heat sink 3 and cap 4 have sufficient wettability, the above mentioned metal coating is not necessary (see FIG. 11A and FIG. 11B).

Next, a method of manufacturing the multi-chip module according to the present embodiment will be explained. The multi-chip module having a mounting structure shown in FIGS. 10A and 10B is packaged, after preparing the substrate 2 on which the semiconductor chips 5 and 6 are mounted and the insulating film 9 is formed, the cap 4 in which the metal "m"is coated beforehand on the inner wall of the opening 4a, and the heat sink 3 in which the metal "m"is coated beforehand on one end portion, for example, by way of the steps of (1) enclosing with the cap 4 the upper surface of the upper substrate 2 fixed on the lower substrate 1, (2) inserting one end of the heat sink 3 into the opening of the cap 4 and allowing its one end to contact with the upper surface of the semiconductor chip 6, and (3) pouring a large amount of liquid state solder "s"into the gap between the inner wall of the opening 4a of the cap 4 and the heat sink 3 in a state in which the heat sink 3 contacts with the semiconductor chip 6 and thereby adhering the solder "s"to one end portion of the heat sink 3 so as to arrive at the semiconductor chip 6, fixing the heat sink 3 to the cap 4 and hermetically sealing the cap 4.

In this case, when the liquid state solder "s"is poured, one end portion of the heat sink 3 is in a state of automatically contacting with the semiconductor chip 6 owing to the self-weight of the heat sink 3, so that the heat sink 3 can be easily fixed to the cap 4.

In addition, the liquid state solder "s"is filled between the heat sink 3 and the inner wall of the opening 4a of the cap without interstice, so that the cap 4 can be sealed hermetically. In particular, when a thin film multi-layered substrate such as polyimide/Cu or the like is used for the upper substrate 2, because polyimide itself has a moisture absorption property, the hermetical sealing becomes important.

Further, the tip end portion of the heat sink 3 is also coated with the metal, so that the self-weight of the solder "s"renders the solder "s"to fill in and gaps between the forward end portion of the heat sink 3 and the semiconductor chip 6, and increase of the contacting area between the semiconductor chip 6 and the heat sink 3 and reduction of the heat resistance can be realized.

In this case, without applying the metal coating to the tip end portion of the heat sink 3, increase of the contacting area between the semiconductor chip 6 and the heat sink 3 and reduction of the heat resistance is realized and a multi-chip module which is excellent in heat dissipation property can be manufactured.

In addition, when the solder "s" is poured, the solder which falls from the upper surface of the semiconductor chip 6 due to an excess amount is received by the insulating film 9 on the upper substrate 2, so that no defective wiring occurs due to flowing into the wiring portion 8 of the upper substrate 2.

Next, an example of the mounting structure of the heat sink in Example 5 according to the fifth embodiment is explained. This example shows the mounting structure in which the semiconductor chip of the third embodiment (see FIG. 8A and FIG. 8B) and the upper substrate of the fourth embodiment (see FIG. 10A and 10B) are applied.

Figure 12A:
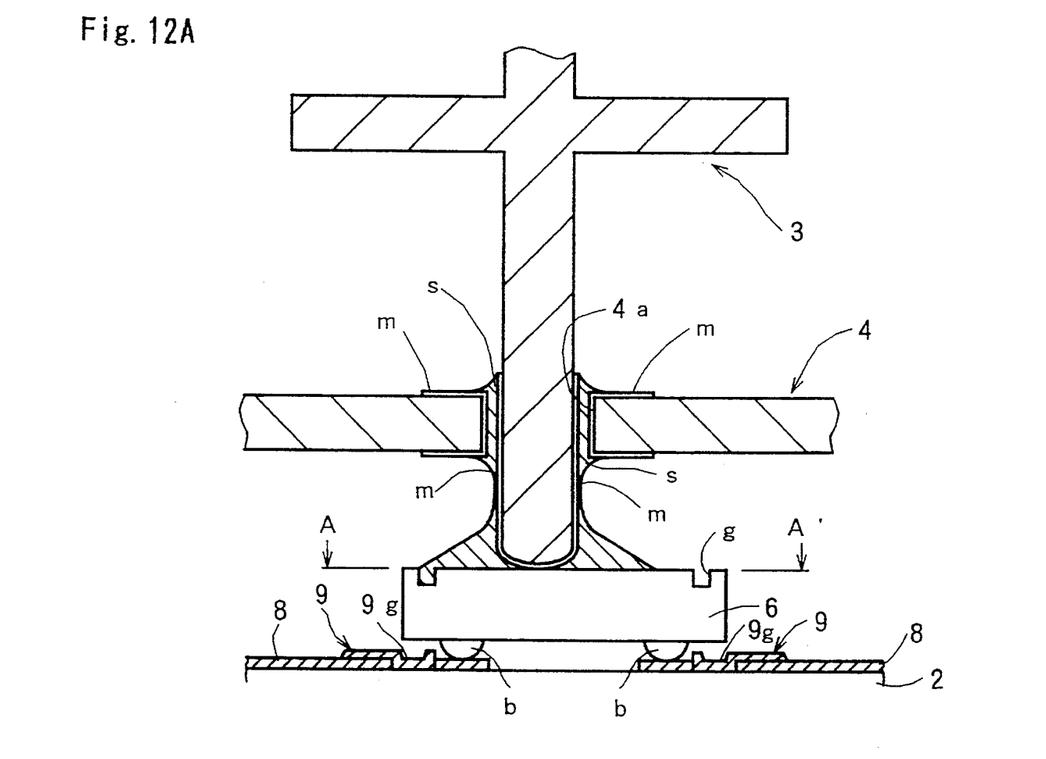
FIGS. 12A and 12B are cross sectional views showing an example of the mounting structure of a heat sink capable of being used for the multi-chip module of the fifth embodiment.
Figure 12B:
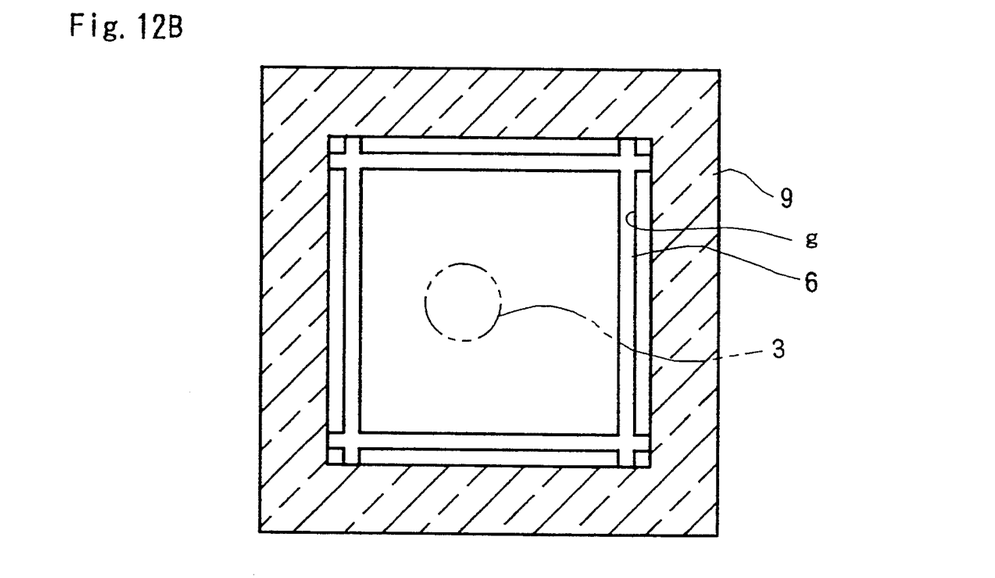

Metal coating is provided on one end portion of heat sink 3 and on the circumferential portion of the hole of cap 4, and any gap between them is filled with solder "s". Moreover, on the circumferential portion of the upper surface of semiconductor chip 6, there is formed a groove "g" connected to the side surface thereof. Because of this, solder "s" flowing along heat sink 3 onto the upper surface of semiconductor chip 6 flows into the groove "g" before it reaches the side surface of semiconductor chip 6. Furthermore, since there is provided a recessed portion 9g formed by an insulating film 9 in the circumference of semiconductor chip 6 on the surface of the upper substrate 2, the solder "s" flowing along groove "g" and falling therefrom can be received.

Incidentally, the present invention is not limited to the above-mentioned embodiment. In the present embodiment, the multi-chip module, in which the semiconductor chips packaged using the wire bonding method and the semiconductor chips packaged using the face-down method are included and the heat sinks are mounted to the semiconductor chips packaged using the face-down method, has been explained as one example, however, it is applicable to a semiconductor chip module which is mounted with a single semiconductor chip, and flip chips in which no heat sink is mounted may be included. Furthermore, the shape of the opening of the cap is not limited to the circular form, which may be rectangular or polygonal if it is a shape nearly similar to one end portion of the heat sink.

The present invention being constituted as described above, a semiconductor chip module applicable to multi-chip module as well as single-chip module, with small number of components and excellent in heat dissipation property capable of good thermal dissipation design, can be provided.

In addition, when the present invention is applied to a multi-chip module, variations of height caused by face-down bonding can be tolerated, resulting in improvement in reliability.

Further, the insulating film is formed on the substrate in the vicinity of the peripheral portion of the semiconductor chip, so that the defective wiring caused by pouring a large amount of adhesive material can be prevented.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

I claim:

1. A semiconductor chip module comprising:
   a first substrate having a wiring portion formed thereon;
   a semiconductor chip having a circuit side and an opposite side, said chip being mounted so that said circuit side faces said wiring portion;
   a heat sink with one end in direct contact with said opposite side of said semiconductor chip;
   a cap enclosing said semiconductor chip and having an opening for exposing externally another end of said heat sink; and
   an adhesive material embedded in a gap between an inner wall of the opening of said cap and said heat sink as well as upon said semiconductor chip around said one end of said heat sink in contact with said semiconductor chip, said adhesive material maintaining said contact between said heat sink and said semiconductor chip.

2. A semiconductor chip module according to claim 1, further comprising a second substrate provided with a mounting portion on which said first substrate is mounted and a fixing portion on which a circumferential portion of said cap is fixed, and enclosing said semiconductor chip together with said cap.

3. A semiconductor chip module comprising:
   a first substrate having a wiring portion formed thereon;
   a semiconductor chip having a circuit side and an opposite side, said chip being mounted so that said circuit side faces said wiring portion;
   a heat sink with one end in contact with said opposite side of said semiconductor chip;
   a cap enclosing said semiconductor chip and having and opening for exposing externally another end of said heat sink; and
   an adhesive material embedded in a gap between an inner wall of said opening of said cap and said heat sink, as well as upon said semiconductor chip around said one end of said heat sink in contact with said semiconductor chip,
   wherein a metal film is formed at least on said inner wall of said opening and on a surface of a heat sink to be inserted into said cap.

4. A semiconductor chip module comprising:
   a first substrate having a wiring portion formed thereon;
   a semiconductor chip having a circuit side and an opposite side, said chip being mounted so that said circuit side faces said wiring portion;
   a heat sink with one end in contact with said opposite side of said semiconductor chip;
   a cap enclosing said semiconductor chip and having an opening for exposing externally another end of said heat sink;
   an adhesive material embedded in a gap between an inner wall of the opening of said cap and said heat sink; and
   a resin material having high heat conductivity formed upon said semiconductor chip around said one end of said heat sink in contact with said semiconductor chip.

5. A semiconductor chip module according to claim 4, further comprising a second substrate provided with a mounting portion on which said first substrate is mounted, and a fixing portion on which a circumferential portion of said cap is fixed, and enclosing said semiconductor chip together with said cap.

6. A semiconductor chip module according to claim 4, wherein a metal film is formed at least on the inner wall of said opening and on a surface of the heat sink facing said inner wall.

7. A semiconductor chip module according to claim 4, wherein said resin is a thermal compound.

8. A semiconductor chip module comprising:
   a first substrate having a wiring portion formed thereon;
   a semiconductor chip having a circuit side and an opposite side, said chip being mounted so that said circuit side faces said wiring portion;
   a heat sink with one end in contact with said opposite side of said semiconductor chip;
   a cap enclosing said semiconductor chip and having and opening for exposing externally another end of said heat sink;
   a groove formed upon said semiconductor chip and surrounding a region which is in contact with said heat sink; and an adhesive material embedded in a gap between an inner wall of the opening of said cap and said heat sink.

9. A semiconductor chip module according to claim 8, further comprising a second substrate provided with an mounting portion on which said first substrate is fixed and a fixing portion on which a circumferential portion of said cap is fixed, and enclosing said semiconductor chip together with said cap.

10. A semiconductor chip module according to claim 8,
wherein a metal film is formed at least on the inner wall of said opening and on a surface of the heat sink to be inserted into an interior of said cap.

11. A semiconductor chip module according to claim 8,
wherein said groove reaches an edge portion of said semiconductor chip and an opening is formed on the side surface thereof.

12. A semiconductor chip module comprising:
a first substrate having a wiring portion formed thereon;
an insulating film formed on said first substrate;
a semiconductor chip having a circuit side and an opposite side, said chip being mounted upon said first substrate so that said circuit side faces said wiring portion, with a circumferential portion of said semiconductor chip in contact with said insulating film;
a heat sink with one end directly contacting said opposite side of said semiconductor chip;
a cap enclosing said semiconductor chip and having an opening for exposing externally another end of said heat sink; and
an adhesive material formed in a gap between an inner wall of the opening of said cap and said heat sink and upon said semiconductor chip around said one end of said heat sink in contact with said chip, said adhesive material maintaining said contact between said heat sink and said semiconductor chip.

13. A semiconductor chip module according to claim 12, further comprising a second substrate provided with a mounting portion on which said first substrate is mounted and a fixing portion on which a circumferential portion of said cap is fixed.

14. A semiconductor chip module comprising:
a first substrate having a wiring portion formed thereon;
an insulating film formed on said first substrate;
a semiconductor chip having a circuit side and an opposite side, said chip being mounted upon said first substrate so that said circuit side faces said wiring portion, with a circumferential portion of said semiconductor chip in contact with said insulating film;
a heat sink with one end contacting said opposite side of said semiconductor chip;
a cap enclosing said semiconductor chip and having an opening for exposing externally another end of said heat sink; and
an adhesive material formed in a gap between an inner wall of said opening of said cap and said heat sink, and upon said semiconductor chip around said one end of said heat sink in contact with said chip,
wherein a metal film is formed on at least said inner wall of said opening and on a surface of a heat sink to be inserted into an interior of said cap.

15. A semiconductor chip module comprising:
a first substrate having a wiring portion formed thereon;
an insulating film formed on said first substrate;
a semiconductor chip having a circuit side and an opposite side, said chip being mounted upon said first substrate so that said circuit side faces said wiring portion, with a circumferential portion of said semiconductor chip in contact with said insulating film;
a heat sink with one end contacting said opposite side of said semiconductor chip;
a cap enclosing said semiconductor chip and having an opening for exposing externally another end of said heat sink; and
an adhesive material formed in a gap between an inner wall of said opening of said cap and said heat sink, and upon said semiconductor chip around said one end of said heat sink in contact with said chip,
wherein a recessed portion is formed on said insulating film in a vicinity of circumferential portion of said semiconductor chip, said recessed portion receiving excess adhesive material flowing off of said semiconductor chip.

16. A semiconductor chip module comprising:
a first substrate having a wiring portion formed thereon;
an insulating film formed on said first substrate;
a semiconductor chip having a circuit side and an opposite side, said chip being mounted upon said first substrate so that said circuit side faces said wiring portion, with a circumferential portion of said semiconductor chip in contact with said insulating film;
a heat sink with one end contacting said opposite side of said semiconductor chip;
a cap enclosing said semiconductor chip and having an opening for exposing externally another end of said heat sink; and
an adhesive material formed in a gap between an inner wall of said opening of said cap and said heat sink, and upon said semiconductor chip around said one end of said heat sink in contact with said chip,
wherein a groove is formed on said semiconductor chip so as to surround a region where said heat sink contacts said semiconductor chip.

* * * * *